(12) United States Patent
Linam et al.

(10) Patent No.: US 6,918,073 B2
(45) Date of Patent: Jul. 12, 2005

(54) DIFFERENTIAL SELF-TEST OF INPUT/OUTPUT CIRCUITS

(75) Inventors: David L Linam, Fort Collins, CO (US); Christopher George Helt, Fort Collins, CO (US); Gayvin E Stong, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 467 days.

(21) Appl. No.: 10/122,398

(22) Filed: Apr. 12, 2002

(65) Prior Publication Data

US 2003/0196150 A1 Oct. 16, 2003

(51) Int. Cl.$^7$ .............................................. G01R 31/28
(52) U.S. Cl. ...................................................... 714/724
(58) Field of Search ................................. 714/724, 718, 714/726, 827, 733; 324/158, 1, 763, 765

(56) References Cited

U.S. PATENT DOCUMENTS 6,563,298 B1 * 5/2003 Creek et al. .............. 324/158.1

* cited by examiner

Primary Examiner—Guy J. Lamarre
Assistant Examiner—James C Kerveros

(57) ABSTRACT

An electronic circuit for enabling differential tests. In representative embodiments, the electronic circuit includes a first differential receiver having first and second inputs and an output, a first switch having first and second data inputs, a control input, and an output, and a first control device having an output. The first input of the first differential receiver is connected to a first contact and to a first single ended receiver input, and the second input of the first differential receiver is connected to a second contact and to a second single ended receiver input. The first data input of first switch is connected to first single ended receiver output, and the second data input of first switch is connected to first differential receiver output. The first control device output is connected to first switch control input. When first control device output is in a specified condition, first data input of first switch is connected to first switch output, otherwise second data input of first switch is connected to first switch output.

39 Claims, 7 Drawing Sheets

DIFFERENTIAL SELF-TEST OF INPUT/OUTPUT CIRCUITS

FIELD OF THE INVENTION

The present invention relates generally to integrated circuits and, more particularly, to the test of integrated circuits, and even more particularly, to the on-chip self-test of integrated circuits.

BACKGROUND OF THE INVENTION

As integrated circuits (IC's) have become more and more complex by including more and more functions in them, effectively testing the IC's has become more and more difficult. The more functions the IC chip contains, the larger the number of circuit blocks which it typically has in order to communicate with other devices external to the IC. The circuit blocks that provide this interface function between the core functions of the IC and the outside world are referred to as input/output (I/O) PAD's. PAD blocks are used to drive signals out of the chip and/or receive signals into the chip. These circuit blocks typically contain drivers for obtaining signals from other chip circuitry and driving them out of the chip, receivers for receiving signals from external devices and propagating those signals to other chip circuitry, test circuits, as well as other interface, control, and data manipulation circuitry, such as registers, logic gates etc.

Historically every I/O PAD on an IC was connected to a separate channel in an integrated circuit test machine so that all I/O PAD's on the IC could be accessed by the machine for testing. However, for expense and other reasons an IC tester has only a limited number of channels which in modern very large scale integrated (VLSI) circuits maybe less than the number of I/O PAD's of the chip. Thus, while a complete, or at least substantial, test of the I/O circuitry is still needed, it becomes impossible to perform in practical applications.

This ongoing need to perform more complete testing of integrated circuit chips has been alleviated by including circuitry on the chip itself for performing a large sub-set of the testing. By appropriately interconnecting the PAD's, this built-in self-test circuitry now enables the I/O PAD's to effectively test each other by connecting a tester channel to only one PAD in a related group of PAD's. Typical tests which are performed are (1) driver leg, (2) leakage, (3) receiver trip, and (4) round-trip timing tests.

Driver tests usually include a driver leg test and a leakage test. A typical driver may include multiple parallel control paths referred to as driver legs for pulling the driver up to its higher potential level and for pulling it down to its lower potential level. It is important to be able to individually test each of these legs. Field effect transistors (FET's) are typically used to perform the pull up/pull down functions. In a related test, leakage of current in the FET's off state is also tested. In typical implementations, so-called weak FET's are included in the on-chip test circuitry. These weak FET's are used to compete with the driver pull-up and pull-down FET's for control of the driver's output level. For the leakage test, the FET's are turned off and the weak FET attempts to pull-up and pull-down the driver potential level. Excessive leakage is indicated if the weak FET is unsuccessful.

Receiver tests usually include a receiver trip test and a round-trip timing test. Drivers, as well as the receivers, are tested by the round trip timing test. The receiver trip test determines the input voltage at which the output of the receiver changes or trips from its lower potential level to its higher potential level and/or the input voltage at which it changes from its higher potential level to its lower potential level. Various input voltages are applied to the input of the receiver, and the input voltage at which the output switches from its previous value to that representative of the input voltage is determined with the output of the receiver having been previously placed in its opposite state. For pass/fail test a preselected input voltage is applied, and then it is determined whether or not the output switches.

In the round-trip timing test, two pads are used to test each other. The PAD contacts are shorted together off-chip for this test. In a typical example, data is driven out of the driver of the first PAD on the rising edge of the clock, and the differential receiver output of the second PAD is latched on the falling edge of the clock. The latched data is then compared to the data that was driven out of the first PAD. The outputs of the driver and receiver were previously placed in complementary states to that switched to during this test. The test is repeated for various clock duty cycles while detecting whether or not the receiver switched states. To test the driver on the second PAD and the receiver on the first PAD, the test is repeated by driving data out of the second PAD on the rising edge of the clock and latching the differential receiver output of the first PAD on the falling edge of the clock. For pass/fail testing a preselected clock duty cycle is used. A failure is indicated if the correct data is not latched into the register.

Existing techniques include circuitry for performing these tests on single ended pads. However, they do not have the capability of performing tests on differential pads. Since differential mode circuits are becoming more and more prevalent on IC chips, there is a growing need to provide circuitry capable of testing such functions.

SUMMARY OF THE INVENTION

An electronic circuit for enabling differential tests is disclosed in a representative embodiment. The electronic circuit includes a first differential receiver having first and second inputs and an output, a first switch having first and second data inputs, a control input, and an output, and a first control device having an output. The first input of the first differential receiver is connected to a first contact and to a first single ended receiver input, and the second input of the first differential receiver is connected to a second contact and to a second single ended receiver input. The first data input of first switch is connected to first single ended receiver output, and the second data input of first switch is connected to first differential receiver output. The first control device output is connected to first switch control input. When first control device output is in a specified condition, first data input of first switch is connected to first switch output, otherwise second data input of first switch is connected to first switch output.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements and.

DETAILED DESCRIPTION OF THE PREFERRED EMBODIMENTS

Figure 1:
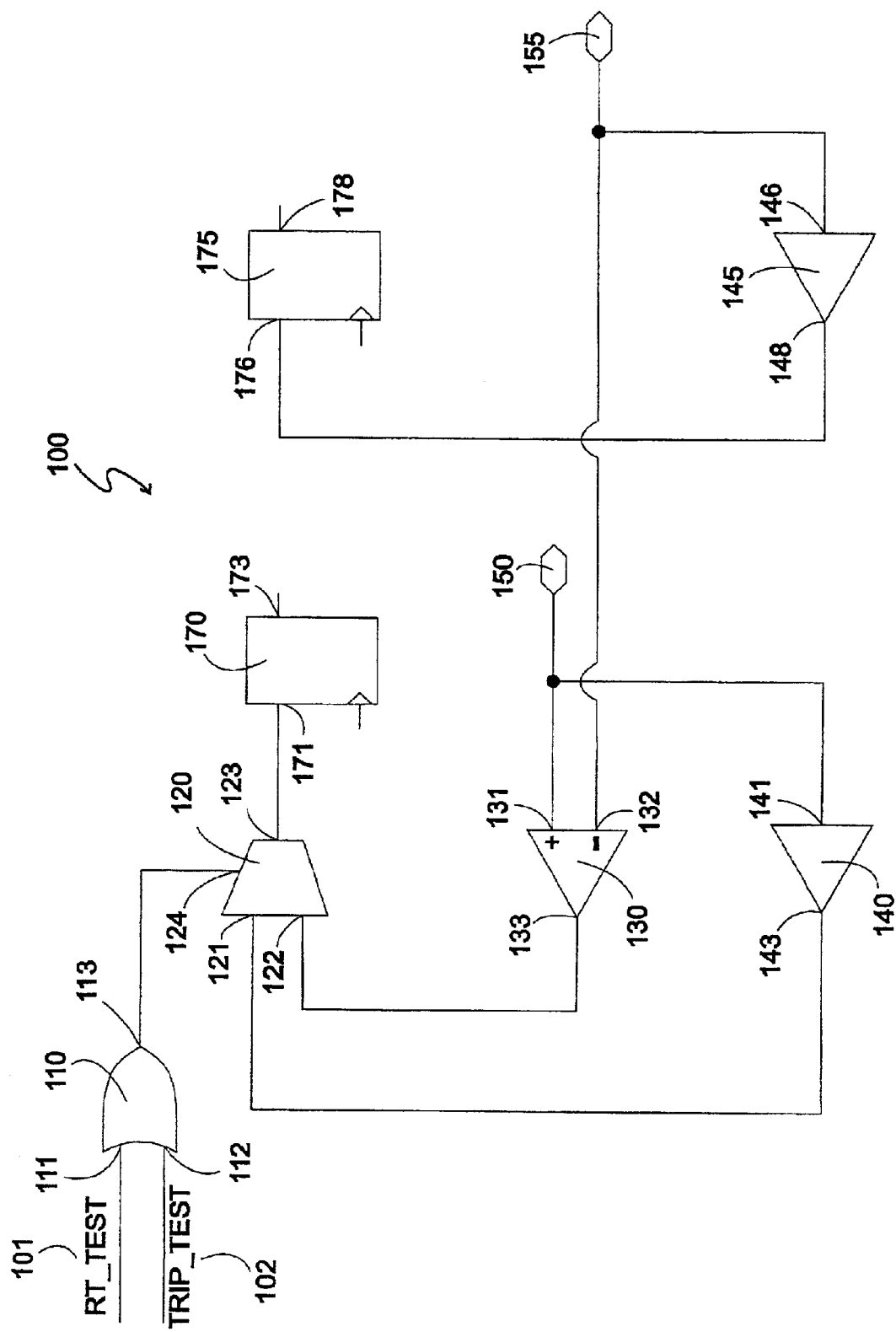
FIG. 1 is a drawing of a differential self-test circuit as described in various representative embodiments consistent with the teachings of the invention.

As shown in the drawings for purposes of illustration, the present patent document relates to novel techniques for performing on-chip self-tests of integrated circuit (IC) differential input/output circuits. Previous methods for on-chip testing of IC input/output circuits have been limited to single ended, as opposed to differential, tests. By providing circuitry and methods for performing these differential self tests means are now provided for ensuring the integrity of differential input/output (I/O) drivers and receivers. In the following detailed description and in the several figures of the drawings, like elements are identified with like reference numerals.

1. Differential I/O PAD Self-Test Circuitry—One Differential Receiver:

FIG. 1 is a drawing of a differential self-test circuit 100 as described in various representative embodiments consistent with the teachings of the invention. The self-test circuit 100, also referred to herein as electronic circuit 100, of FIG. 1 includes a first OR gate 110, also referred to herein as a first control device 110, a multiplexer referred to herein as multiplexer_A 120 and also as first switch 120, a first differential receiver 130, a first single ended receiver 140, a second single ended receiver 145, a first I/O contact 150, also referred to herein as first contact 150, a second I/O contact 155, also referred to herein as second contact 155, a register referred to herein as register_A 170 and also as first data storage device 170, and a register referred to herein as register_B 175 also referred to herein as second data storage device 175.

The first OR gate 110 has a first first-OR-gate input 111, a second first-OR-gate input 112, and a first-OR-gate output 113. The multiplexer_A 120 has a first multiplexer_A input 121, a second multiplexer_A input 122, a multiplexer_A output 123, and a multiplexer_A control input 124. The first differential receiver 130 has a first first-differential-receiver input 131, a second first-differential-receiver input 132, and a first-differential-receiver output 133. The first single ended receiver 140 has a first-single-ended-receiver input 141 and a first-single-ended-receiver output 143. The second single ended receiver 145 has a second-single-ended-receiver input 146, and a second-single-ended-receiver output 148. The register_A 170 has a register_A input 171 and a register_A output 173. The register_B 175 has a register_B input 176 and a register_B output 178.

In the representative embodiment of FIG. 1, the first OR gate 110 receives a perform round-trip timing test signal 101, also referred to herein as a first command 101 and indicated as RT_TEST on FIG. 1, at first first-OR-gate input 111 when the round timing trip test is to be performed. The first OR gate 110 receives a perform receiver trip test signal 102, also referred to herein as a second command 102 and indicated as TRIP_TEST on FIG. 1, at second first-OR-gate input 112 when the receiver trip test is to be performed.

The first I/O contact 150 is available for possible external connection, as for example to a channel of a test machine, and the second I/O contact 155 is also available for possible external connection, as for example to another channel of the test machine. The first I/O contact 150 is connected to the first first-differential-receiver input 131 and to the first-single-ended-receiver input 141. The second I/O contact 155 is connected to the second first-differential-receiver input 132 and to the second-single-ended-receiver input 146. The second-single-ended-receiver output 148 is connected to the register_B input 176, the first-single-ended-receiver output 143 is connected to the first multiplexer_A input 121, and the first-differential-receiver output 133 is connected to the second multiplexer_A input 122. The first-OR-gate output 113 is connected to the multiplexer_A control input 124. And, the multiplexer_A output 123 is connected to the register_A input 171. Values stored in register_A 170 and register_B 175 are accessible to an internal "scan chain" via register_A output 173 and register_B output 178 respectively.

In the representative embodiment of FIG. 1, if either the first command 101 is issued at the first first-OR-gate input 111, as for example by driving that input high, or the second command 102 is issued at the second first-OR-gate input 112, as for example by driving that input high, the multiplexer_A 120 switches its output to permit sampling of the output of the first differential receiver 130. This output is stored in the register_A 170. Switching the multiplexer_A 120 to output the output of the first differential receiver 130 indicates that differential tests, as for example either the round-trip timing test or the receiver trip test are being performed. Otherwise, the multiplexer_A 120 enables sampling the output of the first single ended receiver 140, indicating that a single-ended test or other single ended function is being performed.

Figure 2:
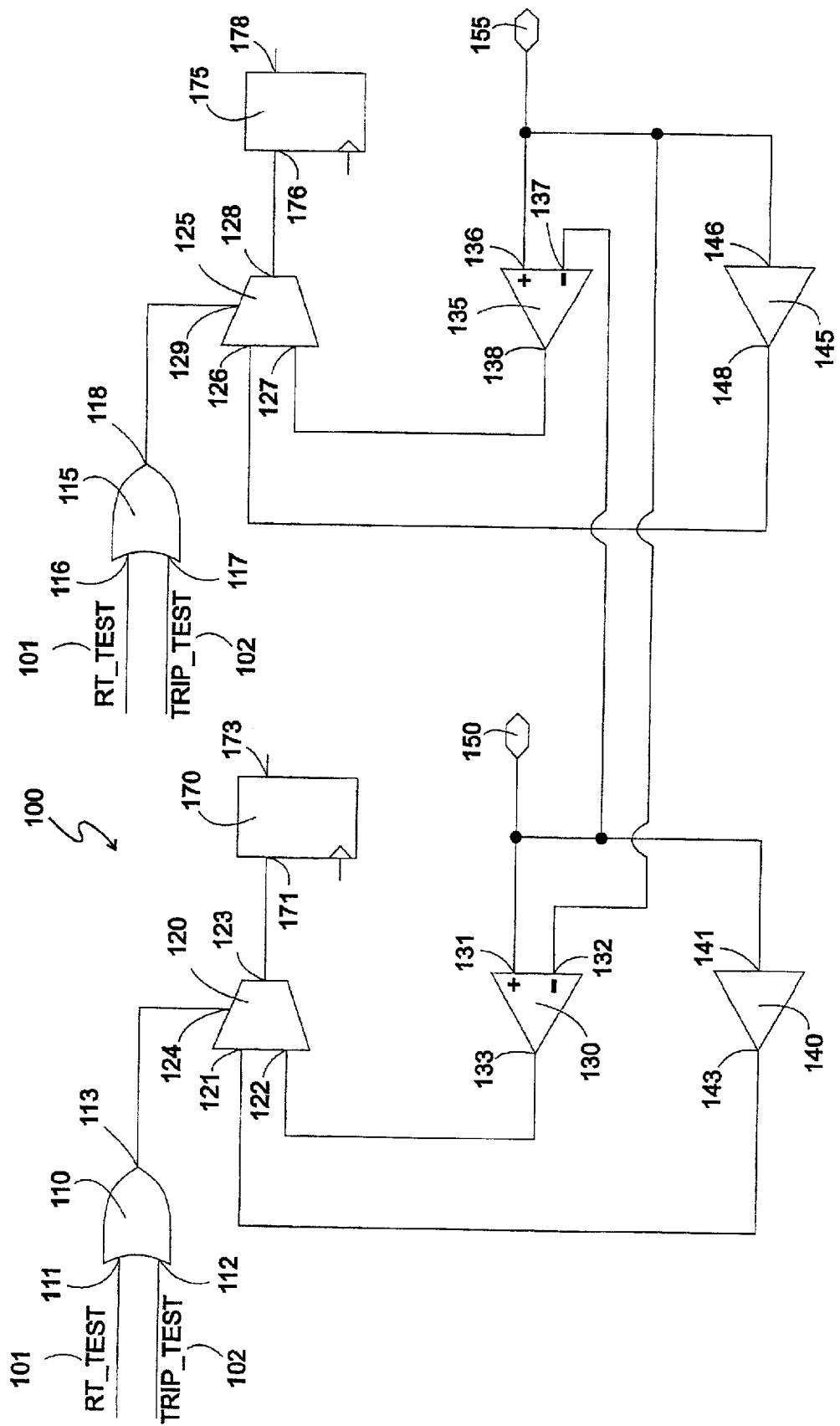
FIG. 2 is another drawing of the differential self-test circuit as described in various representative embodiments consistent with the teachings of the invention.

2. Differential I/O PAD Self-Test Circuitry—Two Differential Receivers:

FIG. 2 is another drawing of the differential self-test circuit 100 as described in various representative embodiments consistent with the teachings of the invention. In addition to the components of FIG. 1, FIG. 2 includes a second OR gate 115 also referred to herein as a second control device 115, a multiplexer referred to herein as multiplexer_B 125 and also as second switch 125, and a second differential receiver 135.

The second OR gate 115 has a first second-OR-gate input 116, a second second-OR-gate input 117, and a second-OR-gate output 118. The multiplexer_B 125 has a first multiplexer_B input 126, a second multiplexer_B input 127, a multiplexer_B output 128, and a multiplexer_B control input 129. The second differential receiver 135 has a first second-differential-receiver input 136, a second second-differential-receiver input 137, and a second-differential-receiver output 138.

In FIG. 2, in addition to being connected to the first first-differential-receiver input 131 and to the first-single-ended-receiver input 141, the first I/O contact 150 is connected to the second second-differential-receiver input 137. Also, in addition to being connected to the second first-differential-receiver input 132 and to the second-single-ended-receiver input 146, the second I/O contact 155 is connected to the first second-differential-receiver input 136. Also in FIG. 2, the second-single-ended-receiver output 148 is now connected to the first multiplexer_B input 126 instead of directly to the register_B input 176 as it is in FIG. 1. The second-differential-receiver output 138 is connected to the second multiplexer_B input 127. The second OR gate 115 respectively receives first and second commands 101, 102 on first and second second-OR-gate inputs 116, 117. The second-OR-gate output 118 is connected to the multiplexer_B control input 129, and the multiplexer_B output 128 is now connected to the register_B input 176.

In the representative embodiment of FIG. 2, if either the first command 101 is issued at the first first-OR-gate input 111, as for example by driving that input high, or the second command 102 is issued at the second first-OR-gate input 112, as for example by driving that input high, the multiplexer_A 120 switches its output to permit sampling of the output of the first differential receiver 130. This output is stored in the register_A 170. Switching the multiplexer_A 120 to output the output of the first differential receiver 130 indicates that differential tests, as for example either the round-trip timing test or the receiver trip test are being performed. Otherwise, the multiplexer_A 120 enables sampling the output of the first single ended receiver 140, indicating that a single-ended test or other single-ended function is being performed.

Also in the representative embodiment of FIG. 2, if either the first command 101 is issued at the first second-OR-gate input 116, as for example by driving that input high, or the second command 102 is issued at the second second-OR-gate input 117, as for example by driving that input high, the multiplexer_B 125 switches its output to permit sampling of the output of the second differential receiver 135. This output is stored in the register_B 175. Switching the multiplexer_B 125 to output the output of the second differential receiver 135 indicates that differential tests, as for example either the round-trip timing test or the receiver trip test are being performed. Otherwise, the multiplexer_B 125 enables sampling the output of the second single ended receiver 145, indicating that a single-ended test or other single-ended function is being performed.

Figure 3:
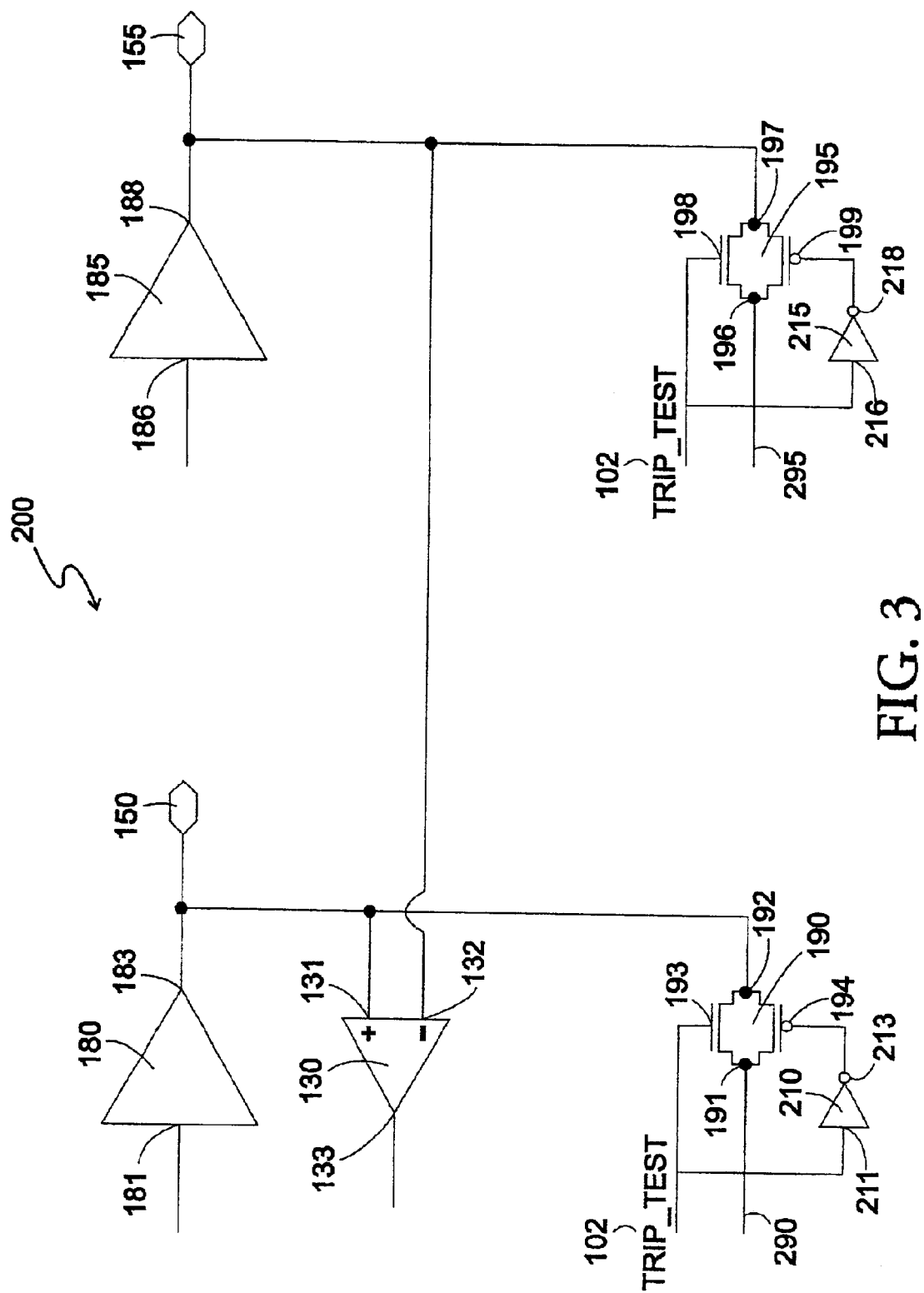
FIG. 3 is a drawing of differential receiver trip test self-test circuitry as described in various representative embodiments consistent with the teachings of the invention.

3. Differential I/O PAD Receiver Trip Test Circuitry:

FIG. 3 is a drawing of differential receiver trip test self-test circuitry 200 as described in various representative embodiments consistent with the teachings of the invention. In addition to the first differential receiver 130, the first I/O contact 150, and the second I/O contact 155, figure 3 includes a first driver 180, a second driver 185, a first bidirectional gate 190, also referred to herein as a third switch 190, a second bidirectional gate 195, also referred to herein as a fourth switch 195, an inverter referred to herein as inverter_A 210 and as first inverter 210, and another inverter referred to herein as inverter_B 215 and as second inverter 215. The first and second bidirectional gates 190, 195 are capable of passing a signal in either direction through them.

The first driver 180 has a first-driver input 181 and a first-driver output 183. The second driver 185 has a second-driver input 186 and a second-driver output 188. The first bidirectional gate 190 has a first first-bidirectional-gate data connection 191, a second first-bidirectional-gate data connection 192, a first first-bidirectional-gate control input 193, and a second first-bidirectional-gate control input 194. The second bidirectional gate 195 has a first second-bidirectional-gate data connection 196, a second second-bidirectional-gate data connection 197, a first second-bidirectional-gate control input 198, and a second second-bidirectional-gate control input 199. The inverter_A 210 has an inverter_A input 211 and an inverter_A output 213. The inverter_B 215 has an inverter_B input 216 and an inverter_B output 218.

In FIG. 3, the first first-bidirectional-gate control input 193 is connected to the inverter_A input 211, and the inverter_A output 213 is connected to the second first-bidirectional-gate control input 194. The first second-bidirectional-gate control input 198 is connected to the inverter_B input 216, and the inverter_B output 218 is connected to the second second-bidirectional-gate control input 199. The second first-bidirectional-gate data connection 192 is connected to the first first-differential-receiver input 131, the first-driver output 183, and the first I/O contact 150. And, the second second-bidirectional-gate data connection 197 is connected to the second first-differential-receiver input 132, the second-driver output 188, and the second I/O contact 155. The first first-bidirectional-gate connection 191 is connected to a first signal path 290, and the first second-bidirectional-gate data connection 196 is connected to a second signal path 295. Receiver trip tests are enabled when the perform receiver trip test signal 102, indicated in FIG. 3 as TRIP_TEST, is received at first first-bidirectional-gate control input 193 and at first second-bidirectional-gate control input 198.

Figure 4:
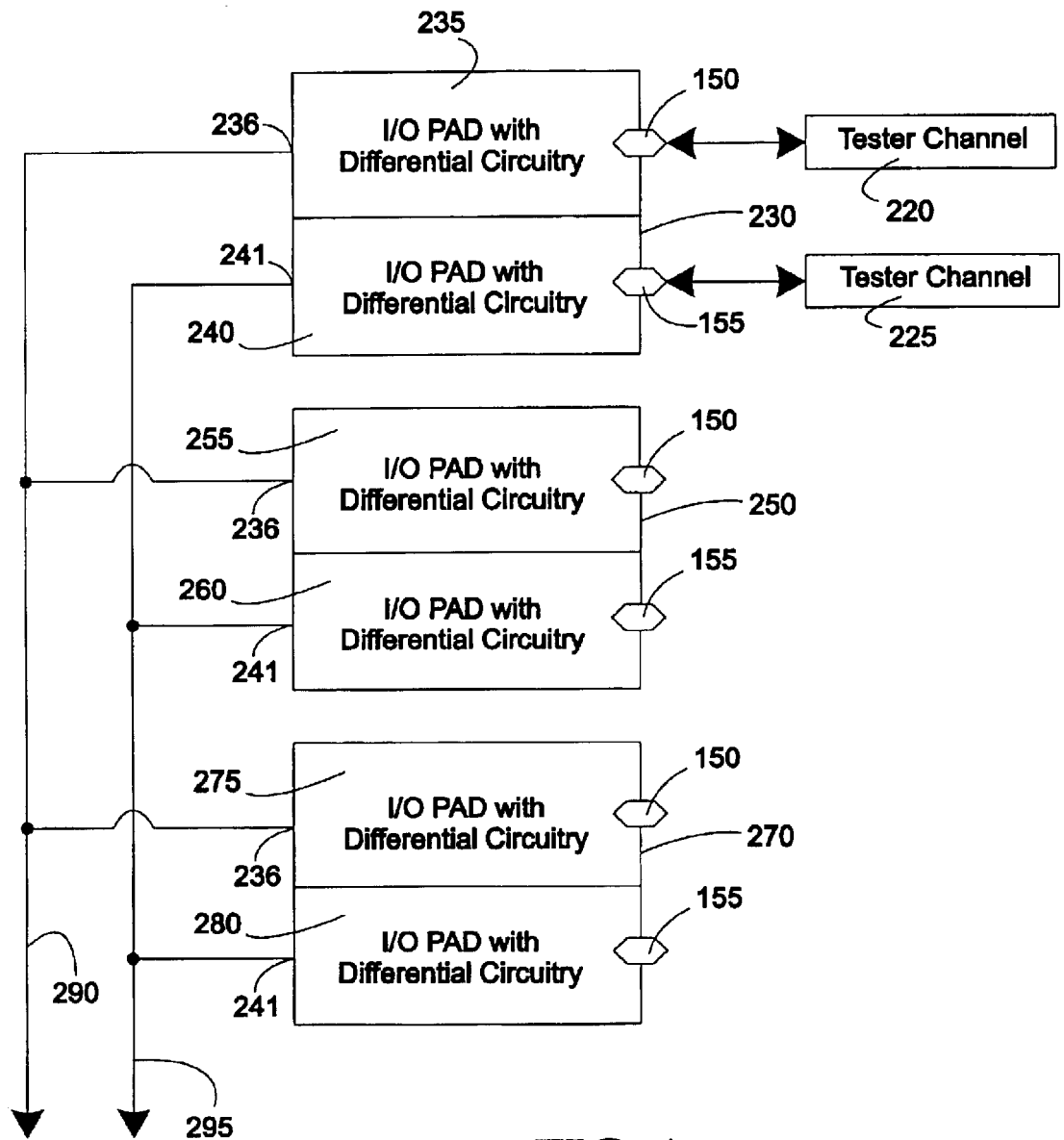
FIG. 4 is a drawing of tester channel connections to and internal connections to I/O contacts for the differential receiver trip test as described in various representative embodiments consistent with the teachings of the invention.

4. Tester Channel Connections & Internal Connections to I/O Contacts—Receiver Trip Test:

FIG. 4 is a drawing of tester channel connections to and internal connections to I/O contacts for the differential receiver trip test as described in various representative embodiments consistent with the teachings of the invention. In FIG. 4, a first I/O PAD 230, also referred to herein as a first I/O circuit 230, includes first-I/O-PAD first differential circuitry 235 and first-I/O-PAD second differential circuitry 240. A second I/O PAD 250, also referred to herein as a second I/O circuit 250, includes second-I/O-PAD first differential circuitry 255 and second-I/O-PAD second differential circuitry 260. And, a third I/O PAD 270, also referred to herein as a third I/O circuit 270, includes third-I/O-PAD first differential circuitry 275 and third-I/O-PAD second differential circuitry 280.

In FIG. 4, the first-I/O-PAD first differential circuitry 235 is connected internally on the integrated circuit to the second-I/O-PAD first differential circuitry 255 and to the third-I/O-PAD first differential circuitry 275 on first signal path 290 at first internal connections 236. Also, the first-I/O-PAD second differential circuitry 240 is connected internally on the integrated circuit to the second-I/O-PAD second differential circuitry 260 and to the third-I/O-PAD second differential circuitry 280 on second signal path 295 at second internal connections 241.

The differential receiver trip test determines the input voltages at which the output of the first differential receiver 130 changes or trips from its lower potential level to its higher potential level or as appropriate from its higher potential level to its lower potential level. Various input voltages are applied to the input of the first differential receiver 130, and the input voltage at which the output switches from its previous value to that representative of the input voltage is determined with the output of the first differential receiver 130 having been previously placed in its opposite state. Preselected input voltages are applied for a pass/fail test, and it is then determined whether or not the output switches by looking at the appropriate register 170. In a similar manner, the differential receiver trip test could be performed on the second differential receiver 135.

In the representative embodiment of FIGS. 3 and 4, differential signals from first and second tester channels 220,225 are inputted to the IC chip via first and second I/O contacts 150,155 of the first I/O PAD 230. These differential signals are transmitted from first and second I/O contacts 150,155 of the first I/O PAD 230 through first and second bidirectional gates 190,195 to the second and third I/O PADs 250,270 and any remaining I/O PADs on the IC chip to be tested together via the first signal path 290 and the second signal path 295 shown in FIG. 3. First and second bidirectional gates 190,195 respectively connect the first and second signal paths 290,295 to first and second first-differential-receiver inputs 131,132 of first differential receivers 130 of the second and third I/O PADs 250,270 and any remaining I/O PADs to be tested together. The first-differential-receiver outputs 133 are connected as shown in FIGS. 1 and 2.

In the manner shown, a given receiver trip test can be performed on all first differential receivers 130, or in a similar manner on all second differential receivers 135, of a particular block of I/O circuits 230,250,270 in a single test using only two tester channels 220,225. The results of this test can be obtained by connecting the register_A's 170 for the various I/O circuits 230,250,270 to internal "scan chains". Data used for the various tests are stored in the registers and test results are obtained from them through the use of "scanable registers". Each register has an auxiliary input port, SCAN_IN, and an auxiliary output port, SCAN_OUT, which are not shown in any of the drawings. The SCAN_IN and SCAN_OUT ports of the registers are cascade-connected into "scan chains". Additional circuitry is provided to scan values into the registers from the tester, perform the desired test, then scan the resulting register values out to the tester for analysis from the appropriate registers.

Figure 5:
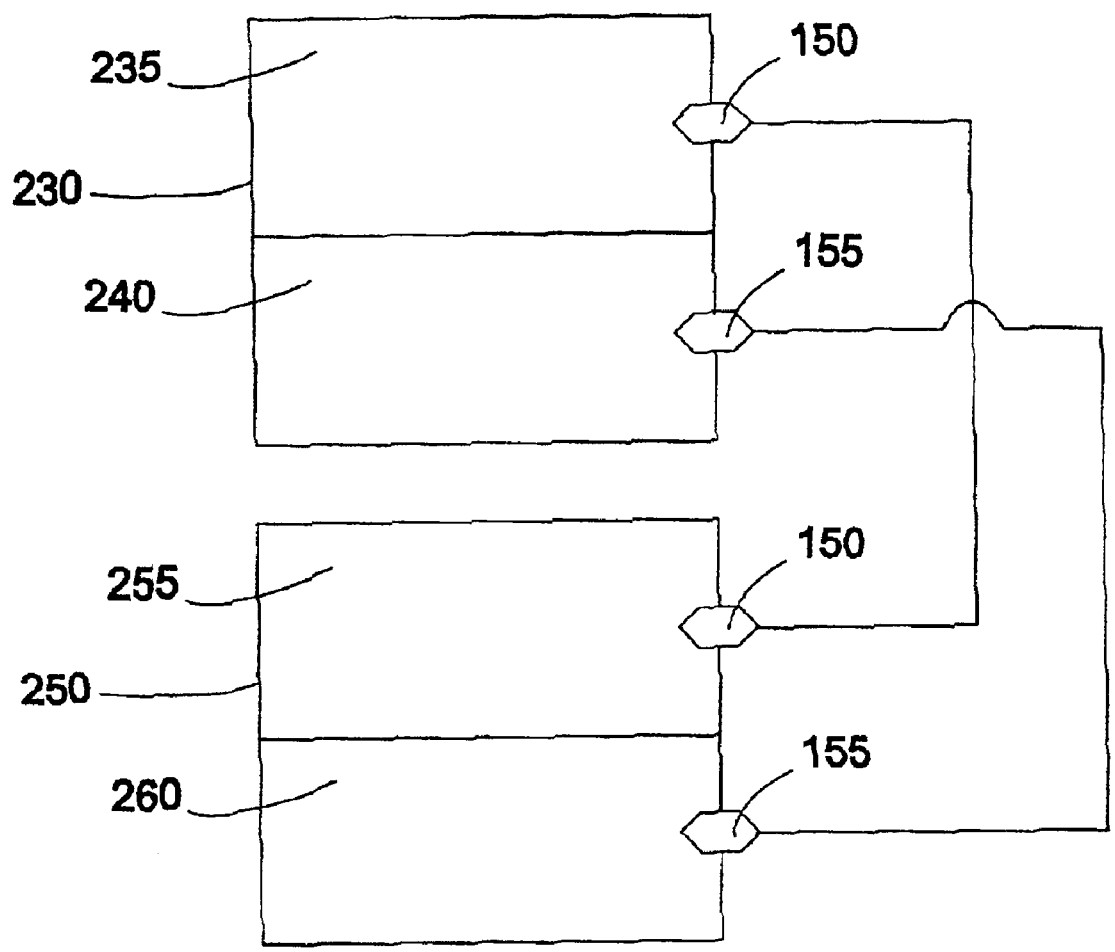
FIG. 5 is a drawing of external I/O contact connections for the differential round-trip timing test as described in various representative embodiments consistent with the teachings of the invention.

5. I/O Contact Connections—Round-Trip Timing Test:

FIG. 5 is a drawing of external I/O contact 150,155 connections for the differential round-trip timing test as described in various representative embodiments consistent with the teachings of the invention. In FIG. 5, the first-I/O-PAD first differential circuitry 235 is connected to the second-I/O-PAD first differential circuitry 255. Also, the first-I/O-PAD second differential circuitry 240 is connected to the second-I/O-PAD second differential circuitry 260.

Figure 6:
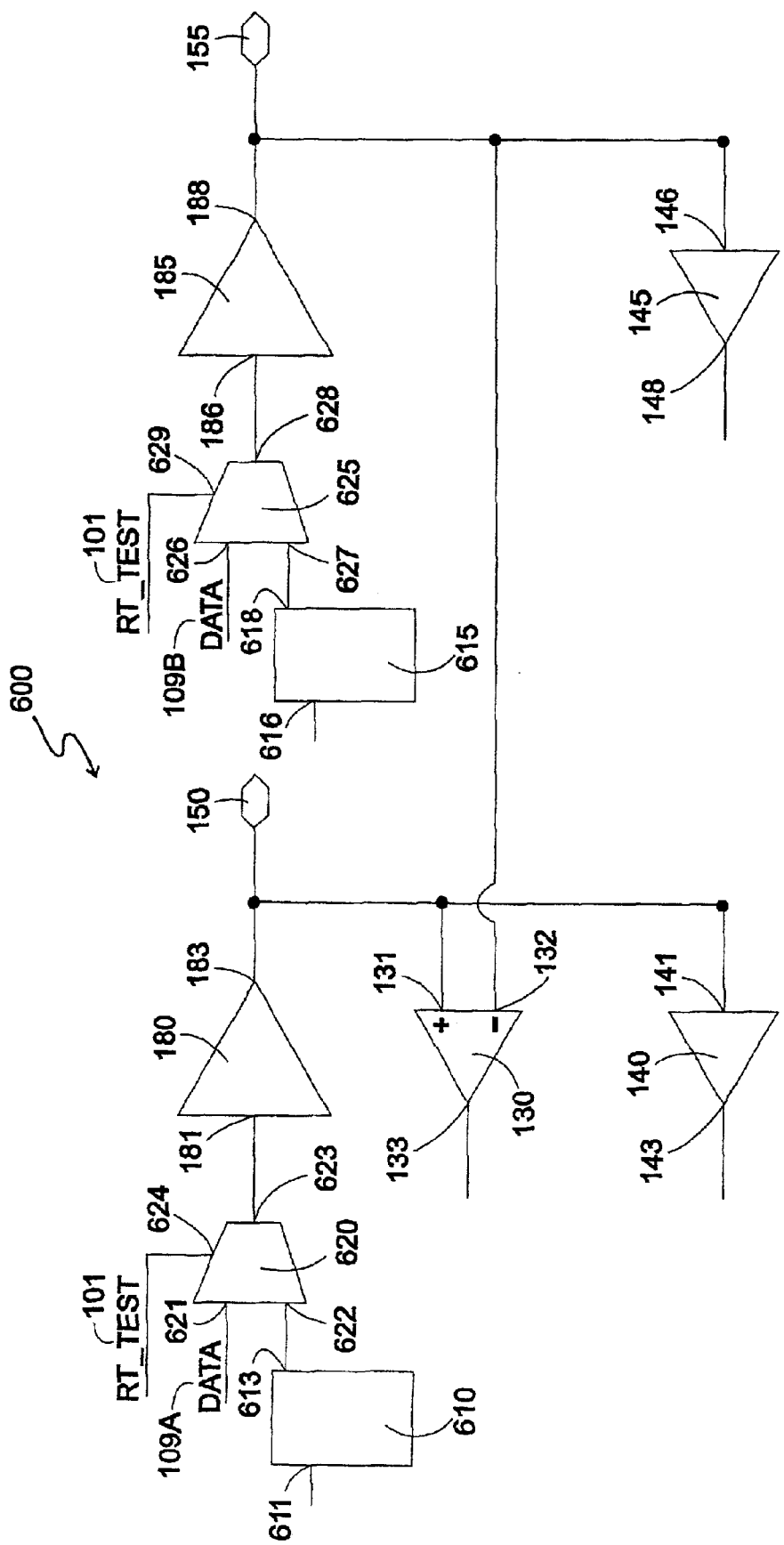
FIG. 6 is a drawing of a differential round-trip timing test self-test circuit as described in various representative embodiments consistent with the teachings of the invention.

6. Differential I/O PAD Round Trip Timing Test Circuitry:

FIG. 6 is a drawing of a differential round-trip timing test self-test circuit 600 as described in various representative embodiments consistent with the teachings of the invention. In addition to the first differential receiver 130, the first and second single ended receivers 140,145, the first and second I/O contacts 150,155, and the first and second drivers 180,185, FIG. 6 includes a register referred to herein as register_C 610 and as third data storage device 610, a register referred to herein as register_D 615 and as fourth data storage device 615, a multiplexer referred to herein as multiplexer_C 620 and also as fifth switch 620, and a multiplexer referred to herein as multiplexer_D 625 and as sixth switch 625.

The register_C 610 has a register_C input 611 and a register_C output 613. The register_D 615 has a register_D input 616 and a register_D output 618. The multiplexer_C 620 has a first multiplexer_C input 621, a second multiplexer_C input 622, a multiplexer_C output 623, and a multiplexer_C control input 624. The multiplexer_D 625 has a first multiplexer_D input 626, a second multiplexer_D input 627, a multiplexer_D output 628, and a multiplexer_D control input 629.

In FIG. 6, the register_C output 613 is connected to the second multiplexer_C input 622. A normal operational data line referred to herein as a first data line 109A, is connected to the first multiplexer_C input 621. The perform round-trip timing test signal 101 received at the multiplexer_C control input 624 forces the multiplexer_C 620 to select the second multiplexer_C input 622 to transmit to the multiplexer_C output 623. The multiplexer_C output 623 is connected to the first-driver input 181. The first-driver output 183 is connected to the first I/O contact 150, to the first first-differential-receiver input 131, and to the first-single-ended-receiver input 141.

The register_D output 618 is connected to the second multiplexer_D input 627. A normal operational data line referred to herein as a second data line 109B, is connected to the first multiplexer_D input 626. The perform round-trip timing test signal 101 received at the multiplexer_D control input 629 forces the multiplexer_D 625 to select the second multiplexer_D input 627 to transmit to the multiplexer_D output 628. The multiplexer_D output 628 is connected to the second-driver input 186. The second-driver output 188 is connected to the second I/O contact 155, to the second first-differential-receiver input 132, and to the second-single-ended-receiver input 146.

In the round-trip timing test two pads are used to test each other. In a typical single ended example, data is driven out of the first I/O PAD 230 by first having previously written data into register_C 610. On the rising edge of the clock signal, data is transferred from register_C 610 to first-driver input 181 of the first driver 180. The data propagates through the first driver 180 with some delay and is then driven out of the first driver 180 via the off-chip connection labeled first I/O contact 150. By externally shorting the first I/O contact 150 of first I/O PAD 230 to the first I/O contact 150 of the second I/O PAD 250, the data appears at the first-single-ended-receiver input 141 of the first single ended receiver 140 of the second I/O PAD 250. The data propagates through the first single ended receiver 140 of the second I/O PAD 250 with some time delay, appears at the first multiplexer_A input 121 of multiplexer_A 120, and finally appears at the register_A input 171 of register_A 170. Register_A 170 is negative edge triggered, whereas register_C 610 is positive edge triggered. Providing the data propagated through the various circuit elements of first and second I/O PADs 230,250 in time, the falling edge of the clock signal will latch data into register_A 170 of the second I/O PAD 250. Prior to test initiation, register_A 170 is placed in a data state complementary to that which is anticipated following the test. A propagation time for the round trip timing test, i.e., the time that it takes to drive data waiting at the input of register_C 610 out of the first I/O PAD 230 to its capture in register_A 170 in second I/O PAD 250, is obtained by reducing the clock signal duty cycle, i.e., by changing the time from the rising edge to the falling edge of the clock, until register_A 170 fails to capture the correct result. The fastest time of valid data propagation is then the fastest time of transfer of valid data. By adjusting the clock signal duty cycle appropriately, the test can be set-up as a "pass/fail" test.

In a typical differential example, data is driven out of the first I/O PAD 230 by first having setup data on the input of register_C 610 and having setup complementary data into register_D 615, i.e., either register_C 610 is high and register_D 615 is low or register_C 610 is low and register_D 615 is high. On the rising edge of the clock signal, data is transferred from register_C 610 to first-driver input 181 of the first driver 180, and data is transferred from register_D 615 to second-driver input 186 of the second driver 185. The data propagates through the first and second drivers 180,185 with some delay and is then driven out of the first and second drivers 180,185 via respectively the off-chip connections labeled first I/O contact 150 and second I/O contact 155. By externally shorting the first I/O contact 150 of first I/O PAD 230 to the first I/O contact 150 of the second I/O PAD 250, and by externally shorting the second I/O contact 155 of first I/O PAD 230 to the second I/O contact 155 of the second I/O PAD 250, the data appears at the first and second first-differential-receiver inputs 131,132 of the first differential receiver 130 of the second I/O PAD 250. The data propagates through the first differential receiver 130 of the second I/O PAD 250. With some time delay, the data appears at the second multiplexer_A input 122 of multiplexer_A 120 of the second I/O PAD 250. The data finally appears at the register_A input 171 of register_A 170 of the second I/O PAD 250. Again, register_A 170, as well as register_B 175, are negative edge triggered, whereas register_C 610 and register_D 615 are positive edge triggered. Providing the data propagated through the various circuit elements of first and second I/O PADs 230,250 in time, the falling edge of the clock signal will latch data into register_A 170 of the second I/O PAD 250. Prior to test initiation, register_A 170 of the second I/O PAD 250 is placed in a data state complementary to that which is anticipated following the test. A propagation time for the differential round trip timing test, i.e., the time that it takes to drive data from the input of register_C 610 out of the first I/O PAD 230 to its capture in register_A 170 in the second I/O PAD 250, is obtained by reducing the clock signal duty cycle, i.e., by changing the time from the rising edge to the falling edge of the clock, until register_A 170 fails to capture the correct result. The fastest time of valid data propagation is then the fastest time of transfer of valid data. And again, by adjusting the clock signal duty cycle appropriately, the test can be set-up as a "pass/fail" test.

Figure 7:
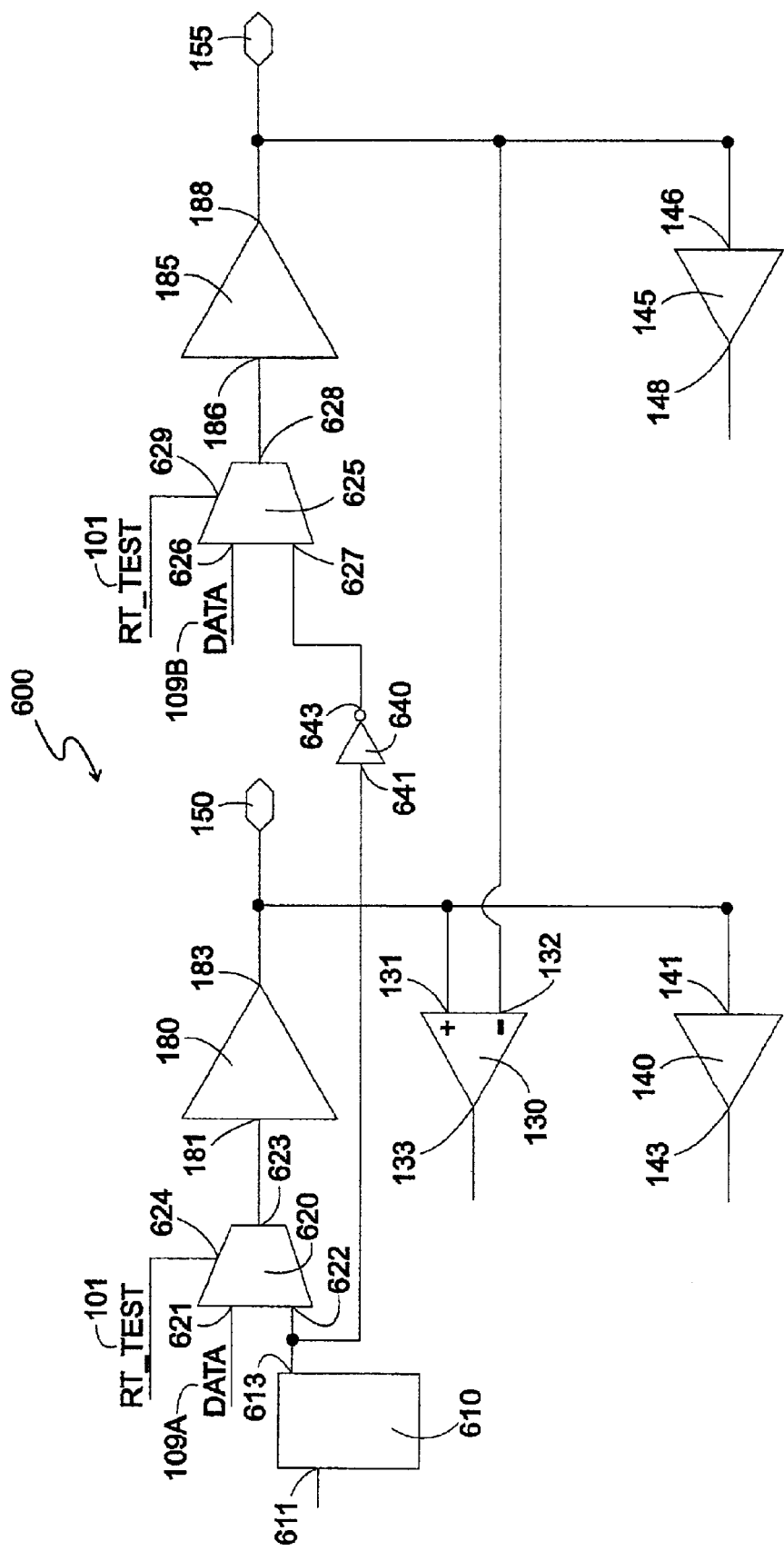
FIG. 7 is another drawing of the differential round-trip timing test self-test circuit as described in various representative embodiments consistent with the teachings of the invention.

FIG. 7 is another drawing of the differential round-trip timing test self-test circuit 600 as described in various representative embodiments consistent with the teachings of the invention. The components in FIG. 7 are the same as those in FIG. 6 with the omission of register_D 615 and the addition of an inverter referred to herein as inverter_C 640 and also as third inverter 640. The inverter_C 640 has inverter_C input 641 and inverter_C output 643.

In FIG. 7, register_C output 613 is connected to the second multiplexer_C input 622. The first data line 109A is connected to the first multiplexer_C input 621. The perform round-trip timing test signal 101 received at the multiplexer_C control input 624 forces the multiplexer_C 620 to select the second multiplexer_C input 622 to transmit to the multiplexer_C output 623. The multiplexer_C output 623 is connected to the first-driver input 181. The first-driver output 183 is connected to the first I/O contact 150, to the first first-differential-receiver input 131, and to the first-single-ended-receiver input 141.

As mentioned above, register_D 615 has been omitted from FIG. 7. In its place register_C output 613 is connected to the inverter_C input 641, and the inverter_C output 643 is connected to the second multiplexer_D input 627. The second data line 109B is connected to the first multiplexer_D input 626. The perform round-trip timing test signal 101 received at the multiplexer_D control input 629 forces the multiplexer_D 625 to select the second multiplexer_D input 627 to transmit to the multiplexer_D output 628. The multiplexer_D output 628 is connected to the second-driver input 186. The second-driver output 188 is connected to the second I/O contact 155, to the second first-differential-receiver input 132, and to the second-single-ended-receiver input 146.

The round trip test in the representative embodiment of FIG. 7 is performed in a manner similar to that described above with respect to FIG. 6. The embodiment of FIG. 7 differs in that the complementary differential signals are obtained from the register_C 610 with inversion obtained via the inverter_C 640. The embodiment of FIG. 6 is preferable to that of FIG. 7 in that issues of the timing shift associated with the inverter_C 640 do not arise with the embodiment of FIG. 6.

While the present invention has been described in detail in relation to preferred embodiments thereof, the described embodiments have been presented by way of example and not by way of limitation. It will be understood by those skilled in the art that various changes may be made in the form and details of the described embodiments resulting in equivalent embodiments that remain within the scope of the appended claims.

What is claimed is:

1. An electronic circuit for enabling differential tests, comprising:

a first differential receiver having first and second inputs and an output, wherein first input of the first differential receiver is connected to a first contact and to a first single ended receiver input and wherein second input of the first differential receiver is connected to a second contact and to a second single ended receiver input;

a first switch having first and second data inputs, a control input, and an output, wherein first data input of first switch is connected to first single ended receiver output and wherein second data input of first switch is connected to first differential receiver output;

a first control device having an output, wherein first control device output is connected to first switch control input and wherein when first control device output is in a specified condition, first data input of first switch is connected to first switch output, otherwise second data input of first switch is connected to first switch output;

a third switch having first and second data connections and first control input, wherein the first data connection of the third switch is connectable to a first signal path and wherein the second data connection of the third switch is connected to a first driver output, the first input of the first differential receiver, and the first contact; and a fourth switch having first and second data connections and first control input, wherein the first data connection of the fourth switch is connectable to a second signal path and wherein the second data connection of the fourth switch is connected to a second driver output, the second data input of the first differential receiver, and the second contact.

2. The electronic circuit as recited in claim 1, wherein first switch output is connected to a first data storage device input.

3. The electronic circuit as recited in claim 1, wherein the first differential receiver, the first switch, the first control device, the first single ended receiver, and the second single ended receiver are fabricated on and interconnected on an integrated circuit.

4. The electronic circuit as recited in claim 1, further comprising:
  a second differential receiver having first and second inputs and an output, wherein first input of the second differential receiver is connected to the second contact and to the second single ended receiver input, and to the second input of the first differential receiver and wherein second input of the second differential receiver is connected to the first contact, to the first input of the first differential receiver, and to the first single ended receiver input;
  a second switch having first and second data inputs, a control input, and an output, wherein first data input of second switch is connected to second single ended receiver output and wherein second data input of second switch is connected to second differential receiver output; and
  a second control device having an output, wherein second control device output is connected to second switch control input and wherein when second control device output is in a specified condition, first data input of second switch is connected to second switch output, otherwise second data input of second switch is connected to second switch output.

5. The electronic circuit as recited in claim 4, wherein second switch output is connected to a second data storage device input.

6. The electronic circuit as recited in clam 4, wherein the second differential receiver, the second switch, the second control device, and the second single ended receiver are fabricated on and interconnected on an integrated circuit.

7. The electronic circuit as recited in claim 1, wherein the third and fourth switches are bidirectional gates.

8. The electronic circuit as recited in claim 1, further comprising:
  a first inverter having an input and an output; and
  a second inverter having an input and an output, wherein the third switch has a second control input, wherein the fourth switch has a second control input, wherein the first inverter input is connected to the first control input of the third switch, wherein the first inverter output is connected to the second control input of the third switch, wherein the second inverter input is connected to the first control input of the fourth switch, and wherein the second inverter output is connected to the second control input of the fourth switch.

9. The electronic circuit as recited in claim 8, wherein the third and fourth switches and the first and second inverters are fabricated on and interconnected on an integrated circuit.

10. The electronic circuit as recited in claim 1, wherein the third and fourth switches are fabricated on and interconnected on an integrated circuit, wherein the first data connection of the third switch is connected internally on the integrated circuit to the first data connection of at least one additional third switch, wherein the first data connection of the fourth switch is connected internally on the integrated circuit to the first data connection of at least one additional fourth switch, wherein the additional third switch is connected to another first contact, wherein the additional fourth switch is connected to another second contact, and wherein the first contact and the second contact are connectable to circuitry external to the electronic circuit.

11. An electronic circuit for enabling differential tests, comprising:
  a first differential receiver having first and second inputs and an output, wherein first input of the first differential receiver is connected to a first contact and to a first single ended receiver input and wherein second input of the first differential receiver is connected to a second contact and to a second single ended receiver input;
  a first switch having first and second data inputs, a control input, and an output, wherein first data input of first switch is connected to first single ended receiver output and wherein second data input of first switch is connected to first differential receiver output;
  a first control device having an output, wherein first control device output is connected to first switch control input and wherein when first control device output is in a specified condition, first data input of first switch is connected to first switch output, otherwise second data input of first switch is connected to first switch output;
  a fifth switch having first and second data inputs, a control input, and an output, wherein first data input of fifth switch is connected to a first data line, wherein operational data is receivable on the first data line, wherein second data input of fifth switch is connected to a third data storage device output, wherein fifth switch output is connected to a first driver input, wherein test data is receivable from the third data storage output, and wherein when a signal to perform a receiver test trip is present at the fifth switch control input, the second data input of fifth switch is connected to fifth switch output, otherwise first data input of fifth switch is connected to fifth switch output; and
  a sixth switch having first and second data inputs, a control input, and an output, wherein first data input of sixth switch is connected to a second data line, wherein operational data is receivable on the second data line, wherein second data input of sixth switch is connected to a fourth data storage device output, wherein sixth switch output is connected to a second driver input, wherein test data is receivable from the fourth data storage output, and wherein when a signal to perform a receiver test trip is present at the sixth switch control input, the second data input of sixth switch is connected to sixth switch output, otherwise first data input of sixth switch is connected to sixth switch output.

12. The electronic circuit as recited in claim 11, wherein the third and fourth data storage devices are registers.

13. The electronic circuit as recited in claim 11, wherein the fifth and sixth switches are multiplexers.

14. The electronic circuit as recited in claim 11, wherein the fifth and sixth switches and the third and fourth data storage devices are fabricated on and interconnected on an integrated circuit.

15. The electronic circuit as recited in claim 11, wherein first switch output is connected to a first data storage device input.

16. The electronic circuit as recited in claim 11, wherein the first differential receiver, the first switch, the first control device, the first single ended receiver, and the second single ended receiver are fabricated on and interconnected on an integrated circuit.

17. The electronic circuit as recited in claim 11, further comprising:
  a second differential receiver having first and second inputs and an output, wherein first input of the second differential receiver is connected to the second contact and to the second single ended receiver input, and to the second input of the first differential receiver and wherein second input of the second differential receiver is connected to the first contact, to the first input of the first differential receiver, and to the first single ended receiver input;

a second switch having first and second data inputs, a control input, and an output, wherein first data input of second switch is connected to second single ended receiver output and wherein second data input of second switch is connected to second differential receiver output; and a second control device having an output, wherein second control device output is connected to second switch control input and wherein when second control device output is in a specified condition, first data input of second switch is connected to second switch output, otherwise second data input of second switch is connected to second switch output.

18. The electronic circuit as recited in claim 17, wherein second switch output is connected to a second data storage device input.

19. The electronic circuit as recited in claim 17, wherein the second differential receiver, the second switch, the second control device, and the second single ended receiver are fabricated on and interconnected on an integrated circuit.

20. An electronic circuit for enabling differential tests, comprising:

a first differential receiver having first and second inputs and an output, wherein first input of the first differential receiver is connected to a first contact and to a first single ended receiver input and wherein second input of the first differential receiver is connected to a second contact and to a second single ended receiver input;

a first switch having first and second data inputs, a control input, and an output, wherein first data input of first switch is connected to first single ended receiver output and wherein second data input of first switch is connected to first differential receiver output;

a first control device having an output, wherein first control device output is connected to first switch control input and wherein when first control device output is in a specified condition, first data input of first switch is connected to first switch output, otherwise second data input of first switch is connected to first switch output, a fifth switch having first and second data inputs, a control input, and an output, wherein first data input of fifth switch is connected to a first data line, wherein operational data is receivable on the first data line, wherein second data input of fifth switch is connected to a third data storage device output, wherein fifth switch output is connected to a first driver input, wherein test data is receivable from the third data storage output, and wherein when a signal to perform a round trip timing test is present at the fifth switch control input, the second data input of fifth switch is propagated to fifth switch output, otherwise first data input of fifth switch is propagated to fifth switch output;

a third inverter having an input and an output, wherein the third inverter input is connected to the second data input of fifth switch; and a sixth switch having first and second data inputs, a control input, and an output, wherein first data input of sixth switch is connected to a second data line, wherein operational data is receivable on the second data line, wherein second data input of sixth switch is connected to the third inverter output, wherein sixth switch output is connected to a second driver input, and wherein when a signal to perform a round trip timing test is present at the sixth switch control input, the second data input of sixth switch is propagated to sixth switch output, otherwise first data input of sixth switch is propagated to sixth switch output.

21. The electronic circuit as recited in claim 20, wherein the third data storage device is a register.

22. The electronic circuit as recited in claim 20, wherein the fifth switch is a multiplexer.

23. The electronic circuit as recited in claim 20, wherein the fifth switch and the third data storage device are fabricated on and interconnected on an integrated circuit.

24. The electronic circuit as recited in claim 20, wherein first switch output is connected to a first data storage device input.

25. The electronic circuit as recited in claim 20, wherein the first differential receiver, the first switch, the first control device, the first single ended receiver, and the second single ended receiver are fabricated on and interconnected on an integrated circuit.

26. The electronic circuit as recited in claim 20, further comprising:

a second differential receiver having first and second inputs and an output, wherein first input of the second differential receiver is connected to the second contact and to the second single ended receiver input, and to the second input of the first differential receiver and wherein second input of the second differential receiver is connected to the first contact, to the first input of the first differential receiver, and to the first single ended receiver input;

a second switch having first and second data inputs, a control input, and an output, wherein first data input of second switch is connected to second single ended receiver output and wherein second data input of second switch is connected to second differential receiver output; and a second control device having an output, wherein second control device output is connected to second switch control input and wherein when second control device output is in a specified condition, first data input of second switch is connected to second switch output, otherwise second data input of second switch is connected to second switch output.

27. The electronic circuit as recited in claim 26, wherein second switch output is connected to a second data storage device input.

28. The electronic circuit as recited in claim 26, wherein the second differential receiver, the second switch, the second control device, and the second single ended receiver are fabricated on and interconnected on an integrated circuit.

29. A method for testing an electronic circuit, comprising:
if a signal to perform a differential test is received:
receiving a differential test signal at a first and a second contacts, wherein the electronic circuit comprises the first contact, the second contact, a first differential receiver, and a first single ended receiver, wherein differential inputs of the first differential receiver are separately connected to the first contact and to the second contact, and wherein the first contact is also attached to input of the first single ended receiver;
sampling output of the first differential receiver; and
storing the sampled output of the first differential receiver; and if a single ended test is to be performed:
  receiving a single ended test signal at the first contact;
  sampling output of the first single ended receiver; and
  storing the sampled output of the first single ended receiver.

30. The method as recited in claim 29, further comprising:
if a single ended test is to be performed:
  receiving another single ended test signal at the second contact;
  sampling output of a second single ended receiver, wherein the second contact is connected to input of the second single ended receiver; and
  storing the sampled output of the second single ended receiver.

31. The method as recited in claim 29, further comprising:
if the signal is received to perform the differential test:
  sampling output of a second differential receiver, wherein differential inputs of the second differential receiver are separately connected to a first contact and a second contact, wherein the second contact is also attached to input of a second single ended receiver, and wherein opposite polarities of the first and second differential receiver inputs are connected respectively to the first contact and to the second contact;
  storing the sampled output of the second differential receiver;
if a single ended test is to be performed:
  receiving another single ended test signal at the second contact;
  sampling output of the second single ended receiver; and
  storing the sampled output of the second single ended receiver.

32. The method as recited in claim 31, wherein a first I/O circuit comprises the first differential receiver, the first single ended receiver, the second differential receiver, and the second single ended receiver on an integrated circuit.

33. The method as recited in claim 29, further comprising:
if the signal is received to perform the differential test:
  comparing the stored, sampled output of the first differential receiver to value expected for tripped condition of the first differential receiver;
  if the stored, sampled output of the first differential receiver matches the value expected for tripped condition of the first differential receiver, assigning a pass condition to the received, differential test signal, otherwise assigning a fail condition to the received, differential test signal; and
  until at least one pass condition and at least one fail condition are obtained,
    incrementing the magnitude of the differential test signal; and
    repeating the steps of receiving a differential test signal at the first and second contacts, sampling output of the first differential receiver, storing the sampled output of the first differential receiver, comparing the stored, sampled output of the first differential receiver to value expected for tripped condition of the first differential receiver, and if the stored, sampled output of the first differential receiver matches the value expected for tripped condition of the first differential receiver, assigning a pass condition to the received, differential test signal, otherwise, assigning a fail condition to the received, differential test signal; and if a single ended test is to be performed:
  comparing the stored, sampled output of the first single ended receiver to value expected for tripped condition of the first single ended receiver;
  if the stored, sampled output of the first single ended receiver matches the value expected for tripped condition of the first single ended receiver, assigning a pass condition to the received, single ended test signal, otherwise assigning a fail condition to the received, single ended test signal; and
  until at least one pass condition and at least one fail condition are obtained,
    incrementing the magnitude of the single ended test signal; and
    repeating the steps of receiving a single ended test signal at the first contact, sampling output of the first single ended receiver, storing the sampled output of the first single ended receiver, comparing the stored, sampled output of the first single ended receiver to value expected for tripped condition of the first single ended receiver, and if the stored, sampled output of the first single ended receiver matches the value expected for tripped condition of the first single ended receiver, assigning a pass condition to the received, single ended test signal, otherwise, assigning a fail condition to the received, single ended test signal.

34. The method as recited in claim 33, wherein the electronic circuit further comprises at least one additional first contact, at least one additional second contact, at least one additional first differential receiver, and at least one additional first single ended receiver, wherein differential inputs of the at least one additional first differential receiver are separately connected to the at least one additional first contact and to the at least one additional second contact, wherein the at least one additional first contact is also attached to input of the at least one additional first single ended receiver, wherein the first contact and the at least one additional first contact are connected together, and wherein the second contact and the at least one additional second contact are connected together so as to enable testing of more than one first differential receivers and more than one first single ended receivers in parallel.

35. The method as recited in claim 34, wherein a first I/O circuit comprises the first differential receiver and the first single ended receiver and wherein a second I/O circuit comprises the additional first differential receiver and the additional first single ended receiver on an integrated circuit.

36. The method as recited in claim 33, wherein a first I/O circuit comprises the first differential receiver and the first single ended receiver.

37. The method as recited in claim 29, a first circuit comprises the first differential receiver and the first single ended receiver.

38. A method for testing an electronic circuit, comprising:
setting a clock speed for the electronic circuit, wherein the electronic circuit comprises a first I/O circuit and a second I/O circuit, wherein the first I/O circuit comprises a first contact, a second contact, a third data storage device, and a fourth data storage device, and a first differential receiver, and a first single ended receiver, wherein differential inputs of the first differential receiver are separately connected to the first contact and to the second contact, and wherein the first contact is also attached to input of the first single ended receiver, wherein the second I/O circuit comprises another first contact, another second contact, a first data storage device, a second data storage device, another first differential receiver, and another first single ended receiver, wherein within the second I/O circuit differential inputs of the first differential receiver are separately connected to the first contact and to the second contact, and wherein within the second I/O circuit the first contact is also attached to input of the first single ended receiver;

storing preselected data in the third data storage device;

if a differential test is to be performed, storing data complementary to the preselected data in the fourth data storage device;

transmitting data from the third data storage device via the first contact of the first I/O circuit to the first data storage device via the first contact of the second I/O circuit;

transmitting data from the fourth data storage device via the second contact of the first I/O circuit to the second data storage device via the second contact of the second I/O circuit;

at the first contact of the second I/O circuit, receiving data transmitted from the first contact of the first I/O circuit;

at the second contact of the second I/O circuit, receiving data transmitted from the second contact of the first I/O circuit;

storing data received at the first contact of the second I/O circuit in the first data storage device;

storing data received at the second contact of the second I/O circuit in the second data storage device; and if the contents of the first and second data storage devices are complements of the expected results previously stored in them, assigning a pass condition to the test, otherwise assigning a fail condition to the test; and otherwise if a single ended test is to he performed, transmitting data from the third data storage device via the first contact of the first I/O circuit to the first data storage device via the first contact of the second I/O circuit;

at the first contact of the second I/O circuit, receiving data transmitted from the first contact of the first I/O circuit;

storing data received at the first contact of the second I/O circuit in the first data storage device; and if the contents of the first storage device is complement of the expected results previously stored in them, assigning a pass condition to the test, otherwise assigning a fail condition to the test.

39. The method as recited in claim 38, wherein the first I/O circuit comprises the first differential receiver and the first single ended receiver and wherein the second I/O circuit comprises the other first differential receiver and the other first single ended receiver on an integrated circuit.

* * * * *